(12) United States Patent
Kubo et al.

(10) Patent No.: US 7,012,680 B2
(45) Date of Patent: Mar. 14, 2006

(54) METHOD AND APPARATUS FOR QUANTITATIVE QUALITY INSPECTION OF SUBSTRATE SUCH AS WAFER

(75) Inventors: Keishi Kubo, Moriguchi (JP); Masateru Doi, Hirakata (JP); Hiroyuki Motizuki, Katano (JP); Keiichi Yoshizumi, Higashiosaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 415 days.

(21) Appl. No.: 10/619,006

(22) Filed: Jul. 15, 2003

(65) Prior Publication Data

US 2004/0090639 A1    May 13, 2004

(30) Foreign Application Priority Data

Jul. 16, 2002    (JP) .............................. 2002-206789

(51) Int. Cl.
*G01N 21/88* (2006.01)
(52) U.S. Cl. .................................... 356/237.1; 356/630
(58) Field of Classification Search ........ 356/630–632, 356/237.1, 237.2, 601
See application file for complete search history.

(56) References Cited

U.S. PATENT DOCUMENTS 4,523,973 A *   6/1985   Nelson ......................... 216/84
6,480,286 B1   11/2002   Kubo et al.

FOREIGN PATENT DOCUMENTS

| JP | 11-195054 | 7/1999 |
| JP | 11-201747 | 7/1999 |

OTHER PUBLICATIONS

SEMI M1-0701$^E$ "Specification for Polished Monocrystalline Silicon Wafers", SEMI M1-0701$^E$ © SEMI 1978, 2001, pp. 1-26.
SEMI M1.15-1000 "Standard for 300mm Polished Monocrystalline Silicon Wafers (Notched)", pp. 1-3, SEMI M1.15-1000 © SEMI 1978, 2001.

* cited by examiner

*Primary Examiner*—Richard A. Rosenberger
(74) *Attorney, Agent, or Firm*—Wenderoth, Lind & Ponack, L.L.P.

(57) ABSTRACT

A method for a quantitative evaluation of a substrate such as wafer defines a number of sequential first regions so that each of the first regions overlaps the adjacent region. A surface data (e.g., thickness data) in each of the first regions is used to determine a normal vector representing a surface configuration (e.g., thickness variation) of the first region. Then, an angular difference between the normal vectors is determined for each combination of adjacent two first regions. Subsequently, the determined angular difference is compared with a reference to evaluate a quality of a second region including at least one of the first regions, e.g., chip region, strip-like region and/or the entire of the wafer.

16 Claims, 8 Drawing Sheets

METHOD AND APPARATUS FOR QUANTITATIVE QUALITY INSPECTION OF SUBSTRATE SUCH AS WAFER

RELATED APPLICATION

The present application claims the benefit of patent application No. 2002-206789, the disclosure of which is hereby incorporated herein by reference.

FIELD OF THE INVENTION

The present invention relates to a method and apparatus for a quantitative quality inspection of a substrate such as wafer and, more particularly, to a method and apparatus for a quantitative inspection of defects due to a thickness variation of the substrate.

DESCRIPTION OF THE RELATED ART

There have been known a quality inspection technique for a substrate such as wafer in which a surface displacement data of the substrate is obtained to determine the maximum thickness and the minimum thickness of the substrate, which is typically employed in the Semiconductor Equipment and Material International (SEMI) M1-0701: Specifications for polished monocrystalline silicon wafers.

Specifically, according to this method a number of measurement points are defined in the substrate. Then, for each of the measurement points a height is measured. The obtained height data is used to determine an imaginary, reference level for the substrate by the least squares. Subsequently, the maximum and the minimum height deviations from the reference level are calculated. Finally, the quality of the wafer is evaluated by the use of a summation of the maximum and the minimum deviations.

SUMMARY OF THE INVENTION

An object of the present invention is to provide an improved method and apparatus for a quantitative defective inspection of a substrate such as wafer.

For this purpose, a method for a quantitative inspection of a substrate such as wafer defines a number of sequential first regions so that each of the first regions overlaps the adjacent first region. A surface data, e.g., thickness data, in each of the first regions is used to determine a normal vector representing a surface configuration, i.e., thickness variation, of the first region. Then, an angular difference between the normal vectors is determined for each combination of adjacent two first regions. Subsequently, the determined angular difference is compared with a reference to evaluate a quality of a second region including at least one of the first regions, e.g., chip region, strip-like region and/or the entire of the wafer.

DETAILED DESCRIPTION OF THE PREFERRED EMBODIMENTS

Figure 1:
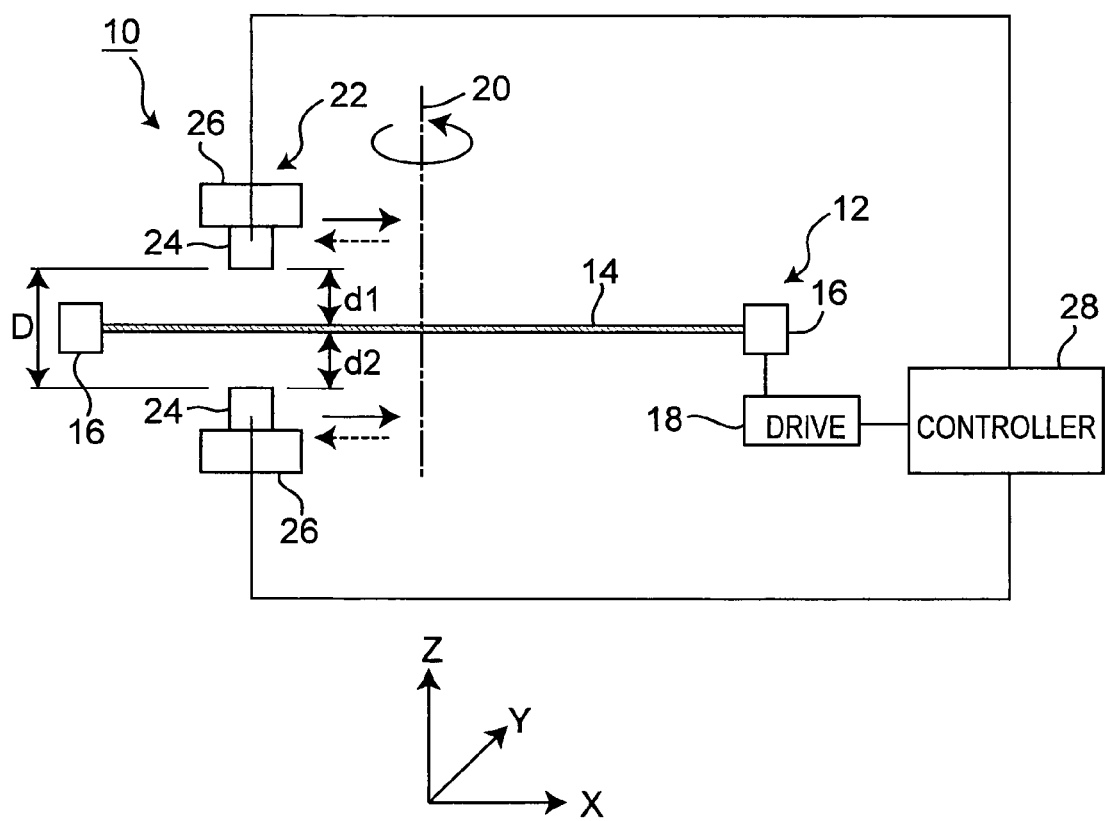
FIG. 1 is a schematic side view showing a system for quantitative inspection of wafer according to a first embodiment of the present invention.

Referring to FIG. 1, there is shown a quality inspection device for substrates such as wafer, generally indicated by reference numeral 10. The inspection device 10 has a mechanism, generally indicated by reference numeral 12, for supporting and rotating a thinned substrate such as silicone wafer 14 in the form of disk. For this purpose, the support mechanism 12 has a chuck 16 for releasably holding a peripheral edge, for example, of the wafer 14. The chuck 16 is in turn mounted on a rotary drive 18 for rotation about a central axis 20 of the wafer 14 indicated along Z-coordinate. The inspection device 10 also has a thickness measuring equipment, generally indicated by reference numeral 22. The measuring equipment 22 has a pair of optical range sensors 24 mounted on opposite sides of the supported wafer 14, leaving a predetermined distance D therebetween in a direction parallel to the Z-coordinate. Preferably, the paired range sensors 24 oppose to each other so that they measure respective distances d1 and d2 from opposing surfaces of the wafer 14 which are used to calculate a wafer thickness (D-d1-d2) at any point of the wafer 14 defined by two-dimensional coordinates, i.e., X- and Y-coordinates. The range sensors 24 are mounted on a translation drive 26 for moving the range sensors 24 in X-direction parallel to X-coordinate across the center of the wafer 14. The rotary drive 18 and the translation dive 26 are electrically connected to a computer or controller 28 for controlling a position in the X- and Y-coordinates of the range sensors 24 relative to the wafer 14. The range sensors 24 are also connected to the controller 28, which allows the controller 28 to receive signals indicating the distances d1 and d2 from the range sensors 24 and then calculate the thickness at every measurement point of the wafer 14. It should be noted that preferably employed for the support and drive mechanism is described in detail in the U.S. Pat. No. 6,480,286 B1 issued to the assignee of this application, which is herein incorporated in its entirety by reference.

Figure 2:
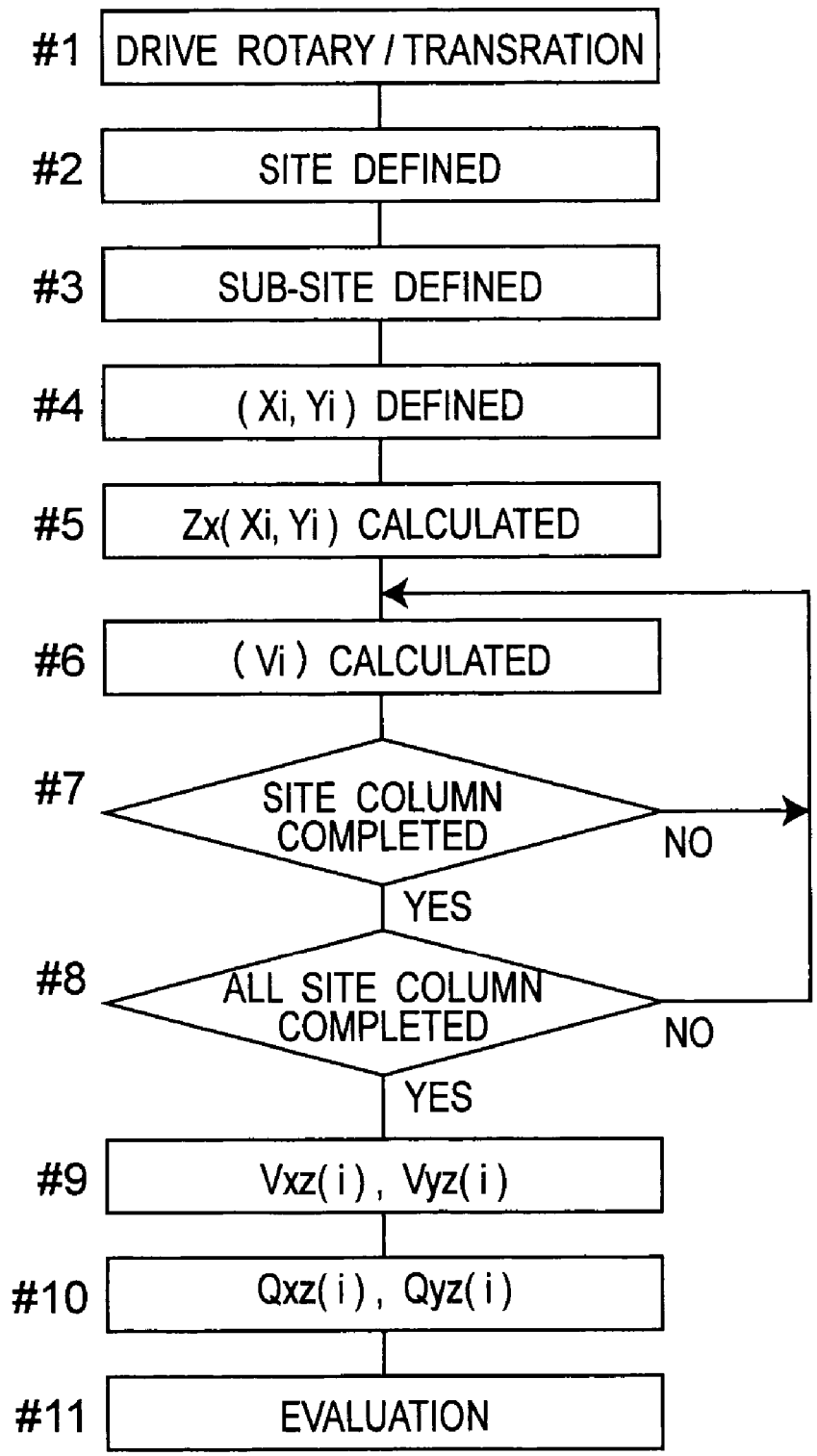
FIG. 2 is a flowchart showing a train of processes for the inspection of the wafer.

An inspection program installed in the controller 28 is designed according to a program flow illustrated in FIG. 2, which will be described in detail below. In this program, at step #1, the controller 28 energizes the rotary drive 18 to rotate the wafer 14 and then energizes the translation drive 26 to move the range sensors 24 across the center of the wafer, allowing the range sensors 24 to measure the respective distances d1 and d2 from the surface of the wafer 14 at a number of measurement points spaced at regular intervals in two-dimensional coordinates (i.e., X- and Y-coordinates). The measurement is stored in a memory of the controller 28.

Figure 3:
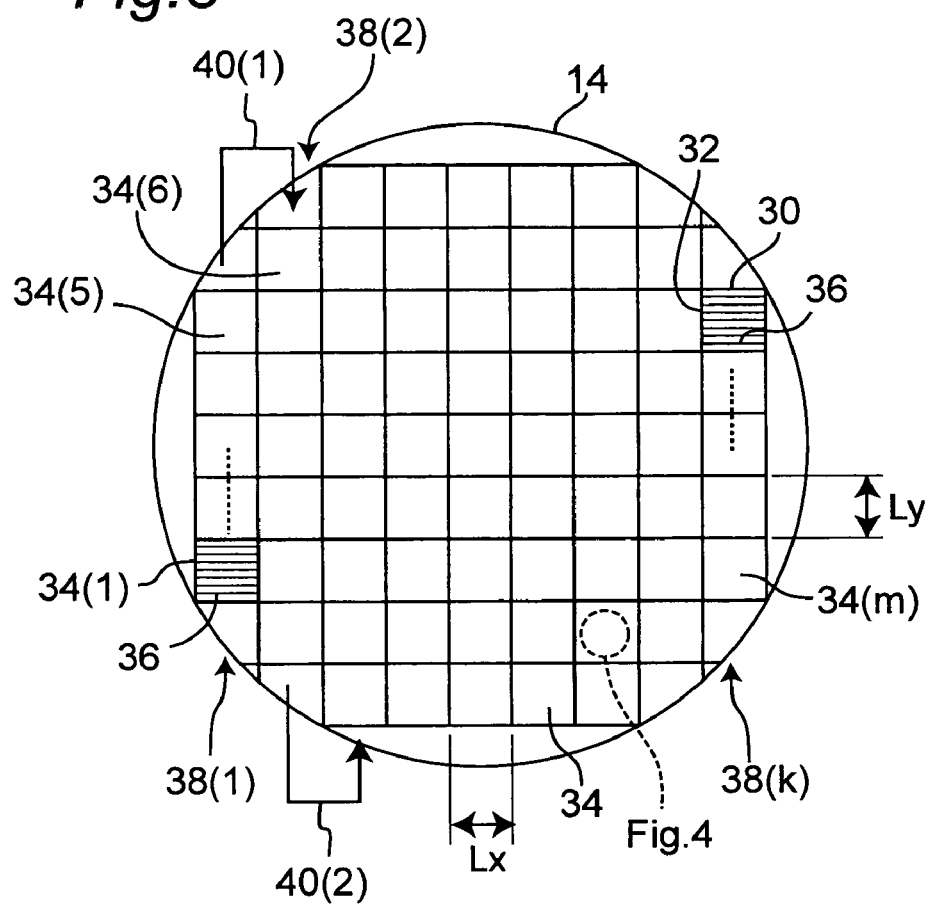
FIG. 3 is a plan view of a silicone wafer.
Figure 4:
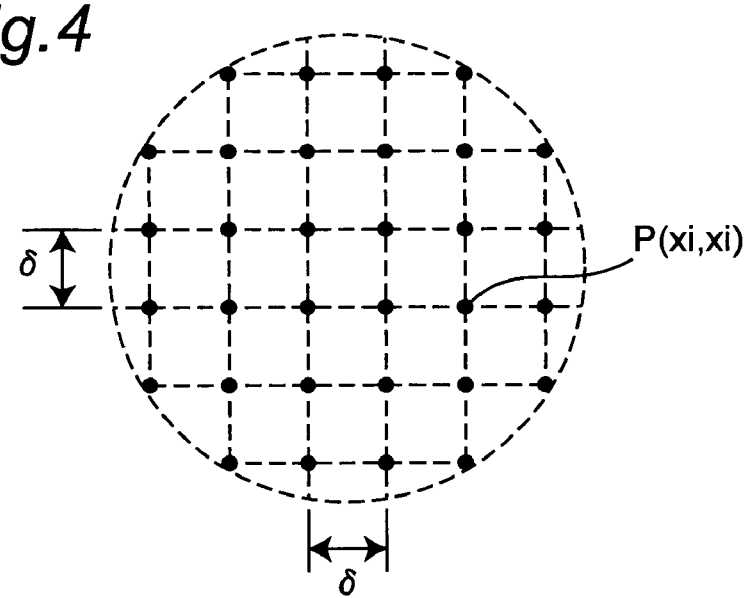
FIG. 4 is an enlarged view of a part of the wafer, showing a number of measurement points defined on the wafer.
Figure 5:
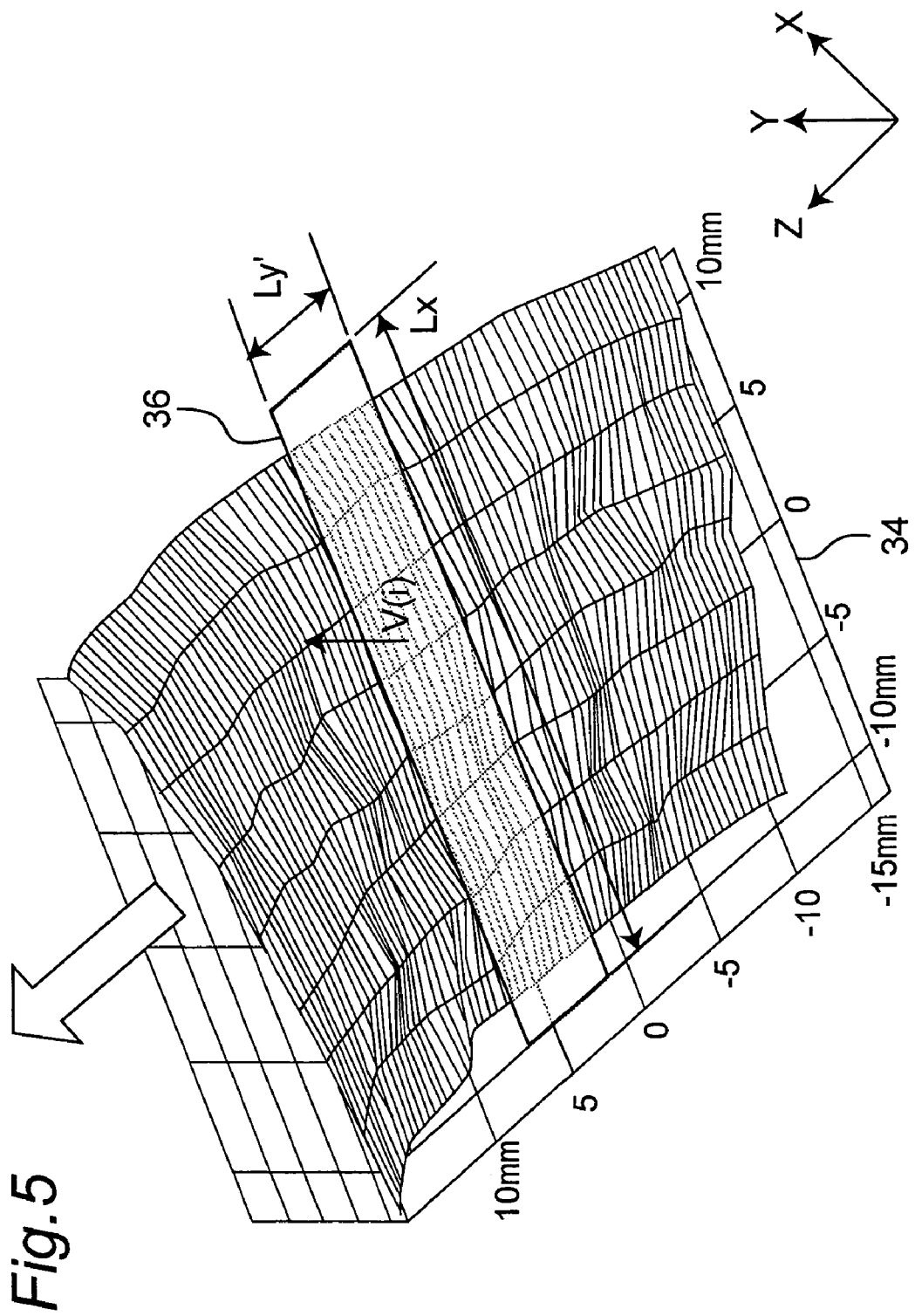
FIG. 5 is a schematic perspective view of site and a sub-site defined in the wafer.
Figure 6:
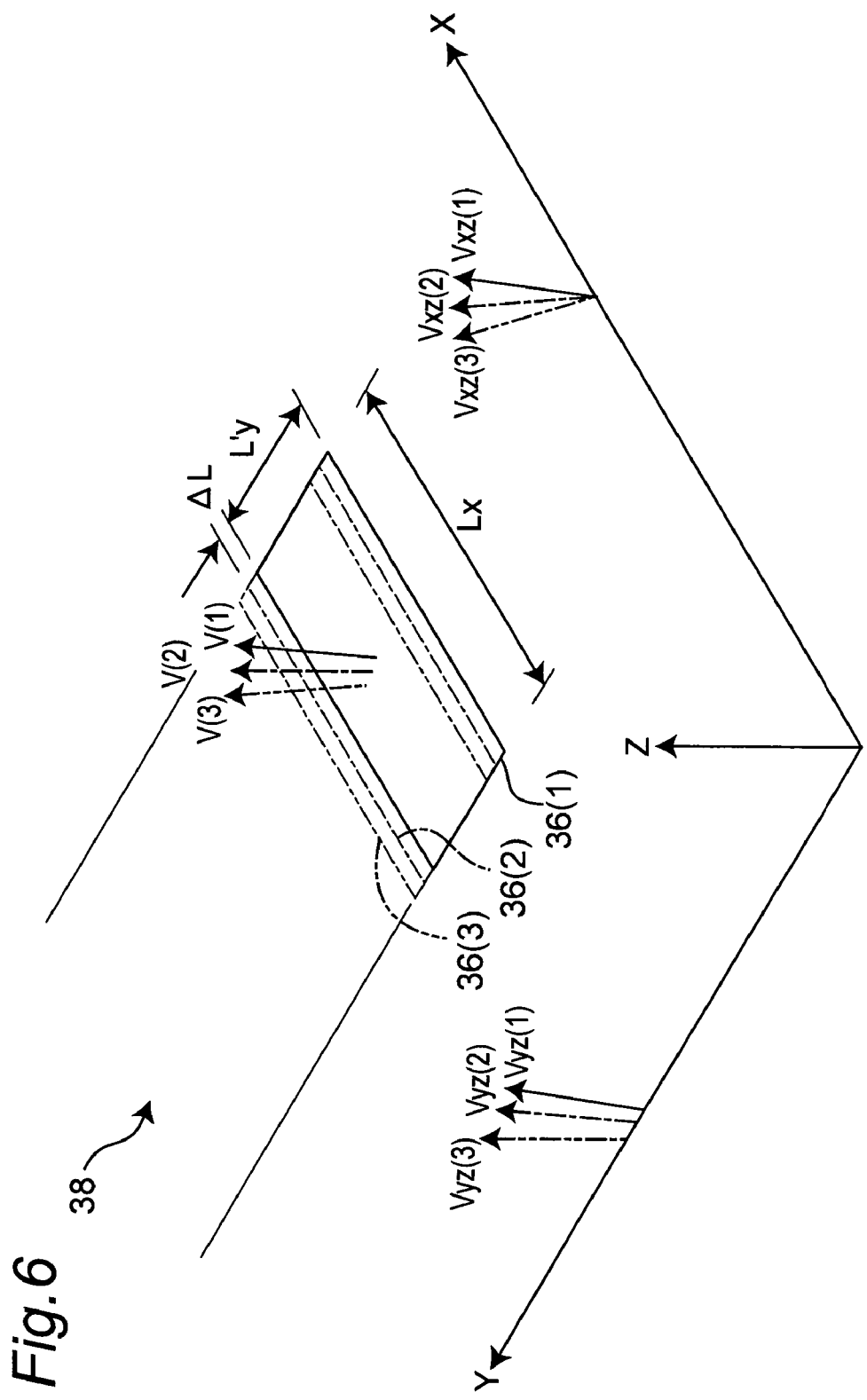
FIG. 6 is a schematic perspective view showing a series of sub-sites.

Next at step #2, as shown in FIG. 3 a surface of the wafer 14 is defined with a number of large regions (second region), i.e., sites 34, divided by imaginary horizontal and vertical lines, 30 and 32, parallel to the X- and Y-coordinates, respectively, and spaced at regular intervals Lx and Ly, e.g., 25 mm and 33 mm, or 25 mm and 25 mm, respectively, corresponding to a resultant chip size. Then, at step #3, a number of small regions (first regions), i.e., sub-sites 36 are defined within each of vertical, strip-like site columns 38. For example, when the site 34 is defined to have the horizontal size of 25 mm, each sub-site 36 is so dimensioned that it has the same horizontal size Lx of 25 mm as the site 34. However, the vertical size Ly' of the sub-site 36 is defined to be 8 mm (see FIG. 5) because the typical exposure device is designed to expose a region of 25 mm by 8 mm. Also, as best shown in FIG. 6 the sub-sites 36 are so arranged that each of the neighboring two sub-sites 36 in a Y-direction parallel to Y-coordinate make an overlap of a certain length of 7 mm, for example. It should be noted that the coordinates of the measurement points are defined by the use of the Cartesian coordinate system throughout the application, they may be defined by the polar coordinate system which might effectively employed for the rotary measurement system.

Then, at step #4, each of the sites 34 and sub-sites 36 so defined are provided with associated measurement points $(x_i, y_i)$ included therein. Next at step #5, the controller 28 calculates each thickness $Z_i(x_i, y_i)$ for all or designated measurement points in the wafer by the use of distances D, d1 and d2 stored in the controller 28. The calculated thickness data is stored in the controller 28.

Using the thickness data, a quality of the wafer 14 is inspected. Specifically, at step #6, the controller 28 reads out the thickness data $Z_i(x_i, y_i)$ associated with each sub-site 36 and, by the use of least square method, calculates a three dimensional normal vector V(i), shown in FIG. 5, representing a thickness variation of the potion of the wafer associated with that sub-site as shown in FIG. 6. This process is first conducted to the first sub-site located at the lowermost end portion of the leftmost site column 38(1) to obtain the normal vector V(1) representing the thickness variation of that small region. Then, the process is performed to the subsequent, second sub-site 36(2) located next to the first sub-site 36(1) within the same site column 38(1) to obtain the normal vector V(2) representing its thickness variation in this region. The above process is performed to all the sub-sites 36 in the first site column 38(1). Once it is determined at step #7 that the process has completed for one site column 38(1), the same process is applied for the adjacent site column 38(2) and then the normal vectors are calculated for all the sub-sites within the site column 38(2). As shown in FIG. 3, in the site column 38(2) the process is performed in the order shown by arrows 40(1) and 40(2). Finally, if it is determined at step #8 that all the normal vectors V(i) are calculated for all the sub-sites 36(1)–36(n) of all the site columns 38(1)–38(k), then the program proceeds to the next step #9.

Figure 7A:
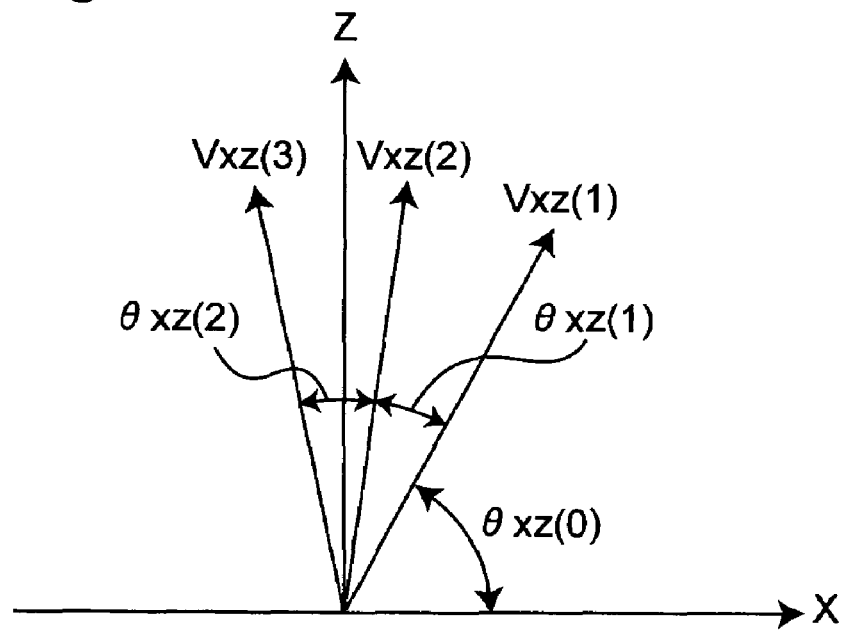
FIG. 7A is a diagram showing component vectors in X-Z plane, obtained by projecting normal vectors shown in FIG. 6.
Figure 7B:
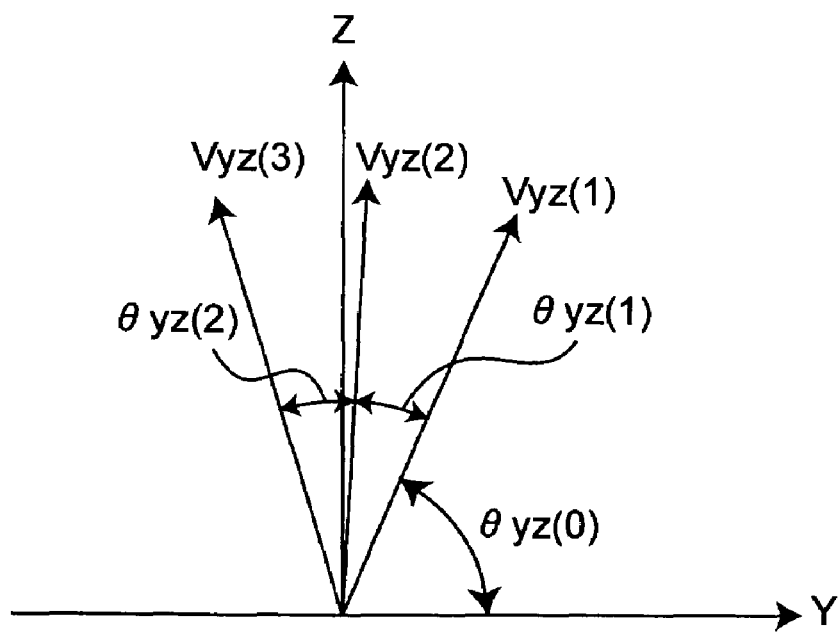
FIG. 7B is a diagram showing component vectors in Y-Z plane, obtained by projecting normal vectors shown in FIG. 6.

At step #9, as shown in FIGS. 6 and 7A the normal vectors V(i) are projected onto a two-dimensional X-Z plane so that X-Z component vectors Vxz(i) are calculated. Simultaneously, as shown in FIGS. 6 and 7B the normal vectors V(i) are also projected onto another vertical plane, two dimensional Y-Z plane so that Y-Z component vectors Vyz(i) are calculated.

Then at step #10, an angular difference θxz(i) between adjacent two projected component vectors, Vxz(i) and Vxz(i+1), in the X-Z plane for each combination of adjacent sub-sites is calculated. Likewise, an angular difference θyz(i) between adjacent two projected component vectors, Vyz(i) and Vyz(i+1), in the Y-Z plane for each of adjacent sub-sites is calculated. At this moment, for the first sub-site 36(1), initial angles θxz(0), θyz(0) of the component vectors Vxz(1), Vyz(1) relative to the horizontal plane are also calculated. The calculated angular differences are then stored in a memory of the controller 28.

Finally, at step #11 the quality inspection is made to each of the sites 34 using the angular differences between the projected component vectors. Specifically, in this quality inspection for each site or chip, each angular difference θxz(i), θyz(i), except for initial angular differences θxz(0), θyz(0), for the sub-sites is compared with a reference angular difference or threshold θth. The threshold angular difference may be determined by an angular responsiveness of a tilting mechanism of an image exposure for exposing semiconductor circuit patterns or images onto the wafer. Then, if it is determined that the angular difference is greater than the threshold, a flag indicating that the site includes defective sub-site is generated and then stored in the memory of the controller 28, which may be used in the exposure process.

Alternatively, rather than comparing each of the angular differences for each site with the threshold, it may be modified that a maximum angular difference of the component vectors is determined for each site and then the determined maximum angular difference is compared with the threshold, thereby determining whether the site is defective.

Figure 8:
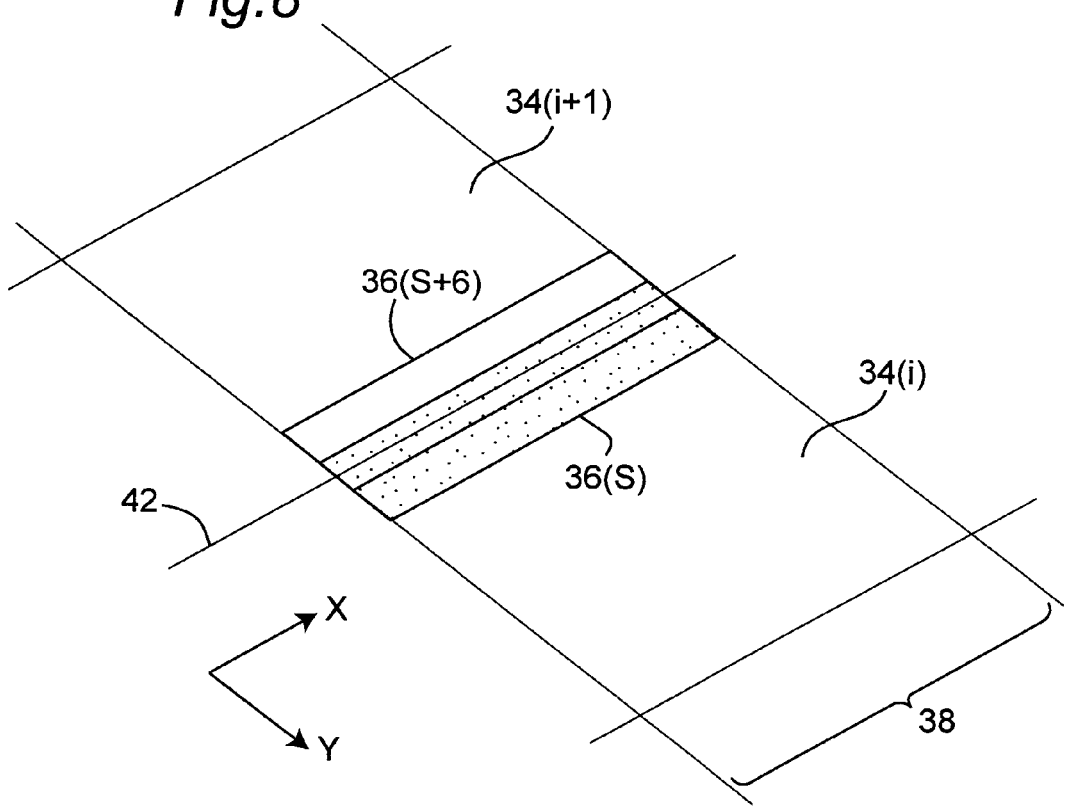
FIG. 8 is a schematic perspective view showing a series of sub-sites defined at the boundary of adjacent sites.

Instead, the quality may be inspected at the boundaries of the neighboring sites. For example, as shown in FIG. 8, if it is assumed that each sub-site 36 has 8 mm length in the Y direction and each sub-site 36 overlaps 1.0 mm with the subsequent sub-site in this direction, then each boundary 42 extending along the X coordinate and between the neighboring sites 34(i) and 34(i+1) is covered by seven sub-sites, 36(s)–36(s+6). Then, the quality of each boundary 42 of the adjacent sites is inspected by the use of angular differences of those sub-sites 36(s)–36(s+6) covering the boundary. Specifically, in this inspection, each angular difference of those sub-sites, the maximum value among those angular differences and/or an average angular difference of those sub-sites is compared with a predetermined threshold.

The above described inspection may be conducted not only for each site but also for each site column 38. In this embodiment, the quality of each site column 38 is so inspected that each angular difference of the sub-sites in the site column 38, the maximum vaule among those angular differences and/or an average angular difference of those sub-sites is compared with a predetermined threshold.

Also, the wafer may be graded by comparing the maximum angular difference with a plurality of predetermined references or statistically by using an angular difference distribution.

As can be seen from above, according to the inspection device of the present invention, the quality of the wafer, each site and/or each site column thereof is evaluated quantitatively and then determined which part of the wafer is defective. Also, the maximum angular difference of the site can be used for the determination whether the site can be used for the semiconductor chip before the exposure, which prevents the exposure device from exposing images to the defective sites and therefore performing the overall exposure process in a reduced time.

Figure 9:
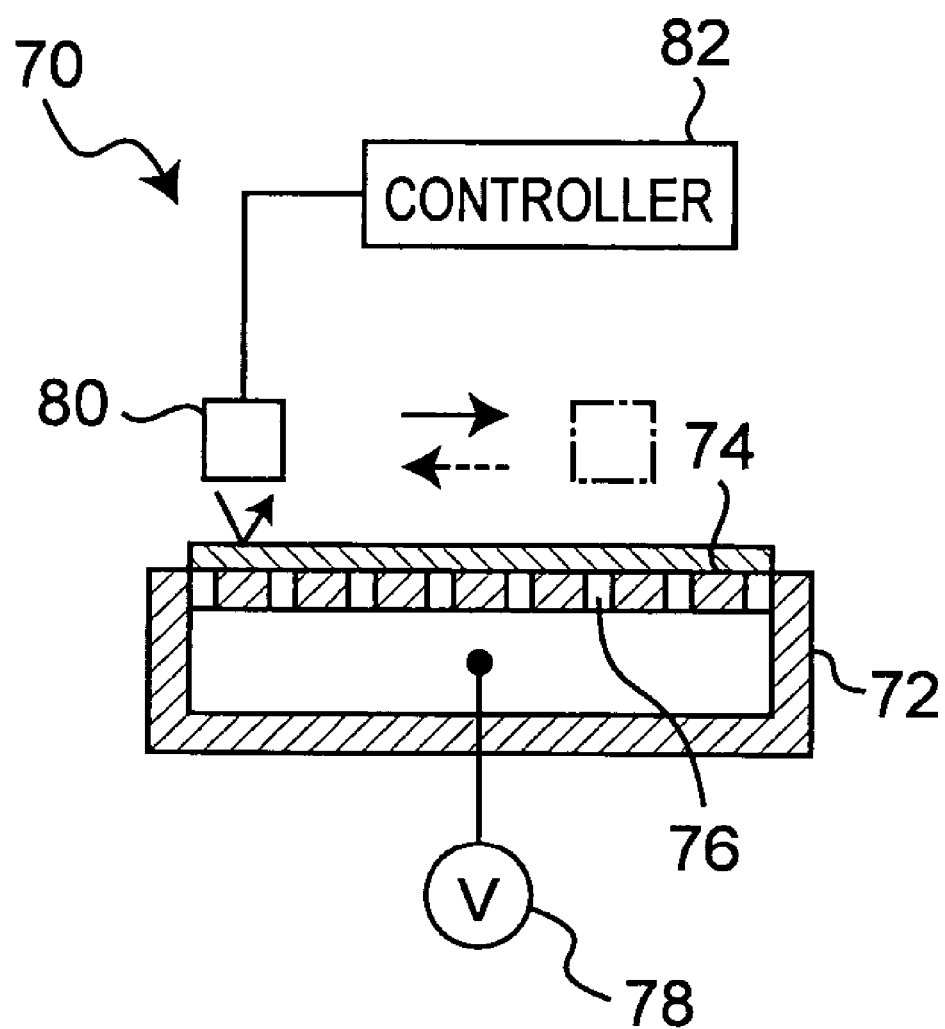
FIG. 9 is a schematic side view showing another inspection device.

Although the rotary inspection device 10 is used in the previous embodiment, it may be replaced with another device 70 shown in FIG. 9. The inspection device 70 has a table 72 having a top surface 74 defined with a plurality of apertures 76 each fluidly connected with a vacuum pump 78. A line sensor or range sensor 80, which is mounted above the table 72 and supported by a transport mechanism not shown, is electrically connected to a controller 82.

In operation, before setting the wafer on the table 72, the range sensor 80 is moved horizontally to detect a two-dimensional height variation of the top surface 74 of the table 72. Then the wafer 14 is placed on the surface 74 and then sucked thereto by the vacuum introduced by the pump 78. Subsequently, the range sensor 80 is moved horizontally to scan the entire top surface of the wafer 14 to measure its height variation. Next, the controller 82 then uses the first height variation of the top surface 74 and the second height variation of the top surface of the wafer and then calculates, at each of points corresponding to the measurement points ($x_i$, $y_i$) defined in the previous embodiment, a difference between the first height and the second height, i.e., thickness. The thickness data so obtained is used for the calculation of the normal vectors and the resultant angular differences described above.

In conclusion, according to the inspection method and apparatus of the present invention, the angular differences between the neighboring sub-sites each corresponding to the exposing areas to which images are exposed by the exposure devices is obtained for the entire area of the wafer. Then by using the angular differences the wafer or the quality of the wafer and/or every chip is pre-evaluated under the condition which is similar to the actual manufacturing. Also, it can be pre-evaluated which part of the chip is defective on a chip-by-chip basis under the condition which is similar to the actual manufacturing. Further, the quality of the wafer portion near the boundary can be pre-evaluated under the condition which is similar to the actual manufacturing.

What is claimed is:

1. A method for a quantitative evaluation of a substrate such as wafer, comprising:
    defining a number of sequential first regions so that each of the first regions overlaps the adjacent first region;
    using a surface data in each of the first regions to determine a normal vector representing a surface configuration of the first region;
    determining an angular difference between the normal vectors for each combination of adjacent two first regions; and
    comparing the determined angular difference with a reference to evaluate a quality of a second region including at least one of the first regions.

2. The method of claim 1, wherein the surface data is a thickness data.

3. The method of claim 1, wherein the surface configuration is a thickness variation.

4. The method of claim 1, wherein the second region corresponds to a semiconductor chip.

5. The method of claim 1, wherein the second region corresponds to a strip-line region defined between two parallel lines in the substrate.

6. The method of claim 1, wherein the second region corresponds to a region covering a boundary of a pair of sites defined in the substrate by spaced apart horizontal and vertical lines.

7. The method of claim 1, wherein the second region corresponds an entire area of the substrate.

8. A method for a quantitative evaluation of a substrate such as wafer, comprising:
    defining a number of sequential first regions so that each of the first regions overlaps the adjacent region;
    using a surface data in each of the first regions to determine a normal vector representing a surface configuration of the first region;
    projecting each of the normal vectors onto a plane to determine an associated projected component vector;
    determining an angular difference between the projected component vectors for each combination of adjacent two first regions; and
    comparing the determined angular difference with a reference to evaluate a quality of a second region including at least one of the first regions.

9. The method of claim 8, wherein the surface data is a thickness data.

10. The method of claim 9, wherein the surface configuration is a thickness variation.

11. An apparatus for a quantitative evaluation of a substrate such as wafer, comprising:
    means for defining a number of sequential first regions so that each of the first regions overlaps the adjacent first region;
    means for using a surface data in each of the first regions to determine a normal vector representing a surface configuration of the first region;
    means for determining an angular difference between the normal vectors for each combination of adjacent two first regions; and
    means for comparing the determined angular difference with a reference to evaluate a quality of a second region including at least one of the first regions.

12. The apparatus of claim 11, wherein the surface data is a thickness data.

13. The apparatus of claim 11, wherein the surface configuration is a thickness variation.

14. An apparatus for a quantitative evaluation of a substrate such as wafer, comprising:
    means for defining a number of sequential first regions so that each of the first regions overlaps the adjacent first region;
    means for using a surface data in each of the first regions to determine a normal vector representing a surface configuration of the first region;
    means for projecting each of the normal vectors onto a plane to determine an associated projected component vector;
    means for determining an angular difference between the projected component vectors for each combination of adjacent two first regions; and
    means for comparing the determined angular difference with a reference to evaluate a quality of a second region including at least one of the first regions.

15. The apparatus of claim 14, wherein the surface data is a thickness data.

16. The apparatus of claim 14, wherein the surface configuration is a thickness variation.

* * * * *